(12) United States Patent
Yamamoto et al.

(10) Patent No.: US 8,999,227 B2
(45) Date of Patent: Apr. 7, 2015

(54) METHOD FOR PRODUCING REGENERATED TARGET

(71) Applicant: Tanaka Holdings Co., Ltd., Tokyo (JP)

(72) Inventors: Toshiya Yamamoto, Tsukuba (JP); Takanobu Miyashita, Tsukuba (JP); Osamu Itoh, Tsukuba (JP)

(73) Assignee: Tanaka Holdings Co., Ltd, Tokyo (JP)

( * ) Notice: Subject to any disclaimer, the term of this patent is extended or adjusted under 35 U.S.C. 154(b) by 0 days.

(21) Appl. No.: 13/727,171

(22) Filed: Dec. 26, 2012

(65) Prior Publication Data

US 2013/0115125 A1 May 9, 2013

Related U.S. Application Data

(63) Continuation of application No. 13/141,261, filed as application No. PCT/JP2009/071055 on Dec. 17, 2009, now Pat. No. 8,460,602.

(30) Foreign Application Priority Data

Dec. 26, 2008 (JP) ................. 2008-332330

(51) Int. Cl.
*B22F 3/14* (2006.01)
*B22F 7/02* (2006.01)
(Continued)

(52) U.S. Cl.
CPC ............... *B22F 7/02* (2013.01); *C04B 35/645* (2013.01); *C23C 14/3414* (2013.01)

(58) Field of Classification Search
CPC ............................ C04B 35/645; B22F 7/02
USPC .......................................................... 419/10
See application file for complete search history.

(56) References Cited

U.S. PATENT DOCUMENTS 5,354,446 A 10/1994 Kida et al.
7,871,563 B2 1/2011 Acker et al.
(Continued)

FOREIGN PATENT DOCUMENTS

JP A-62-230967 10/1987
JP A-63-093859 4/1988
(Continued)

OTHER PUBLICATIONS

International Search Report issued in International Patent Application No. PCT/JP2009/071055 dated Feb. 2, 2010.
(Continued)

*Primary Examiner* — Jessee Roe
*Assistant Examiner* — Christopher Kessler
(74) *Attorney, Agent, or Firm* — Oliff PLC (57) ABSTRACT

A sintering method with uniaxial pressing includes: a powder filling step of disposing a spent target in an inner space of a frame jig having the inner space piercing in a uniaxial direction, and filling the inner space with a raw material powder for a target to cover an erosion part side of the spent target with the raw material powder for a target, a cushioning-material disposition step of disposing a deformable cushioning material so that the raw material powder for a target with which the inner space has been filled in the powder filling step is sandwiched between the spent target and the deformable cushioning material; and a sintering step of pressing the raw material powder for a target with which the inner space has been filled and the spent target in the uniaxial direction through the cushioning material and sintering them.

18 Claims, 9 Drawing Sheets

(51) Int. Cl.
  *C04B 35/645* (2006.01)
  *C23C 14/34* (2006.01)

(56) References Cited

U.S. PATENT DOCUMENTS

| | | |
|---|---|---|
| 2002/0130041 A1 | 9/2002 | Wen et al. |
| 2003/0077199 A1 | 4/2003 | Sandlin et al. |
| 2004/0182700 A1 | 9/2004 | Natsume et al. |
| 2010/0012488 A1 | 1/2010 | Koenigsmann et al. |

FOREIGN PATENT DOCUMENTS

| | | |
|---|---|---|
| JP | A-2000-239837 | 9/2000 |
| JP | A-2001-342562 | 12/2001 |
| JP | A-2003-82455 | 3/2003 |
| JP | A-2004-035919 | 2/2004 |
| JP | A-2004-225091 | 8/2004 |
| JP | A-2005-508444 | 3/2005 |
| JP | A-2005-112658 | 4/2005 |
| JP | A-2006-272420 | 10/2006 |
| WO | WO 03/025244 A2 | 3/2003 |

OTHER PUBLICATIONS

Notification of Reasons for Refusal dated Mar. 3, 2009 in Japanese Patent Application No. 2008-332330 (with translation).
International Preliminary Report on Patentability dated Aug. 16, 2011 in International Application No. PCT/JP2009/071055.
Informal Comments submitted by applicant on Jun. 10, 2010 in International Application No. PCT/JP2009/071055 (with translation).
Office Action dated Sep. 26, 2012 from U.S. Appl. No. 13/141,261.

METHOD FOR PRODUCING REGENERATED TARGET

This is a Continuation of Application No. 13/141,261 filed Jun. 21, 2011, now U.S. Pat. No. 8,460,602, which in turn is a National Stage application of PCT/JP2009/071055 filed on Dec. 17, 2009, which claims the benefit JP 2008-332330 filed on Dec. 26, 2008. The disclosure of the prior applications is hereby incorporated by reference herein in its entirety.

TECHNICAL FIELD

The present invention relates to a method for producing a regenerated target, and in particular, to a method for producing a regenerated target by a sintering method in which a raw material powder for a target is pressed in the uniaxial direction (hereinafter, may be referred to as a uniaxial pressure sintering method).

BACKGROUND ART

A sputtering method has been widely used to produce recording media such as hard disks and optical discs.

However, a target used in a film deposition step during sputtering is only used at an amount of about 40 to 60% at most of its total mass according to the principles of the film deposition method.

Therefore, recycling of a spent target has been desired. This recycling is achieved, for example, by a wet process in which a metal is separated and recovered for each constituent element after being melted by an acid and the like. As another exemplary method of the recycling, a spent target may be subjected to a refinement process of a metal that constitutes the target. However, these methods of recovery entail high cost, and are uneconomical.

On the other hand, Patent Literature 1 describes a technique to produce a regenerated target by using an HIP method after filling an eroded groove of a spent target with a new raw material powder for a target.

Also, Patent Literatures 2 and 3 describe a technique to produce a regenerated target by using an HIP method after covering not only an eroded groove of the spent target but also the regions except the eroded groove with a raw material powder for a target having the same composition as the spent target.

However, the HIP method is required to use an HIP apparatus which results in high cost.

On the other hand, Patent Literature 4 describes a technique to produce a regenerated target by using a hot-pressing method with uniaxial pressing instead of the HIP method. Specifically, it describes a technique to carry out hot-pressing with a new raw material powder for a target being placed on an erosion part side of the spent target.

CITATION LIST

Patent Literature

Patent Literature 1: Japanese Translation of PCT Patent Application No. 2005-508444
Patent Literature 2: Japanese Patent Application Laid-Open No. 2001-342562
Patent Literature 3: Japanese Patent Application Laid-Open No. 2004-35919
Patent Literature 4: Japanese Patent Application Laid-Open No. Sho 63-93859

SUMMARY OF INVENTION

Technical Problem

The present inventors, however, found that the obtained regenerated target had a lot of voids when hot-pressing was carried out with the new raw material powder for a target being placed on the erosion part side of the spent target according to the technique described in Patent Literature 4.

The present invention has been made in view of the aforementioned problems, and an object of the invention is to provide a method for producing a regenerated target wherein the regenerated target reduced in voids is produced by a sintering method with uniaxial pressing.

Solution to Problem

The present inventors found that the obtained regenerated target had a lot of voids in the place of the eroded groove of the erosion part side. The present inventors considered that it was caused by the following. The layer of the new raw material powder for a target placed on the erosion part side of the spent target, which was placed in the place of the eroded groove of the erosion part side, was thicker than those at other places. Therefore, in the hot-pressing method in which pressure was applied in the thickness direction (in the uniaxial direction) of the layer of the raw material powder for a target, a sufficient pressure was not applied to the raw material powder for a target placed in the place of the eroded groove of the erosion part side surface. Accordingly, the present inventors considered that, even by the hot-pressing method with uniaxial pressing, if the method is devised so that an isotropic pressure is applied to the new raw material powder for a target, a sufficient pressure is applied to the raw material powder for a target placed in the place of the eroded groove of the erosion part side, thereby reducing voids in the regenerated target to be obtained. And, the present inventors made the present invention.

That is, a first aspect of a method for producing a regenerated target according to the present invention solving the above problems is a method for producing a regenerated target, including: a powder filling step of disposing a spent target made of a metal sintered body or a composite sintered body of a metal and a metal compound in an inner space of a frame jig having the inner space piercing in a uniaxial direction, and filling the inner space with a raw material powder for a target made of a metal or made of a metal and a metal compound to cover an erosion part side of the spent target with the raw material powder for a target; a cushioning-material disposition step of disposing a deformable cushioning material made of an inorganic fiber so that the raw material powder for a target with which the inner space has been filled in the powder filling step is sandwiched between the spent target and the cushioning material; and a sintering step of pressing the raw material powder for a target with which the inner space has been filled and the spent target in the uniaxial direction through the cushioning material disposed in the cushioning-material disposition step and sintering them.

A second aspect of a method for producing a regenerated target according to the present invention solving the above problems is a method for producing a regenerated target, including: a powder filling step of disposing a spent target made of a metal sintered body or a composite sintered body of a metal and a metal compound in an inner space of a frame jig having the inner space piercing in a vertical direction with an erosion part side facing upward, and filling the inner space with a raw material powder for a target made of a metal or made of a metal and a metal compound to cover the erosion part side of the spent target with the raw material powder for a target; a cushioning-material disposition step of disposing a deformable cushioning material made of an inorganic fiber on an upper side of the raw material powder for a target with which the inner space has been filled in the powder filling step; and a sintering step of pressing the raw material powder for a target with which the inner space has been filled and the spent target from the upper side in a uniaxial direction through the cushioning material disposed in the cushioning-material disposition step and sintering them.

In the present invention, the raw material powder for a target covering the erosion part side of the spent target and the spent target are pressed in the uniaxial direction through the deformable cushioning material, and then the raw material powder for a target is sintered. Accordingly, even under uniaxial pressing, an isotropic pressure is more easily applied to the entire raw material powder, and therefore the pressure is also more easily transmitted to the raw material powder with which the eroded groove of the erosion part has been filled and to the raw material powder with which a stepped portion of the spent target has been filled. Thus, voids in the obtained sintered body can be reduced even by the sintering method with uniaxial pressing. Examples of the sintering method with uniaxial pressing include hot-pressing sintering method, electric heating sintering method, and spark plasma sintering method.

In the cushioning-material disposition step, it is preferred that the cushioning material be disposed so as to cover the entire raw material powder for a target since an isotropic pressure is more easily applied to the raw material powder for a target.

A plurality of layered sheets of the cushioning material may be disposed.

When the cushioning material is disposed in the cushioning-material disposition step so that an amount of the cushioning material to be disposed is larger in a thicker region of the layer of the raw material powder for a target covering the erosion part side of the spent target in the powder filling step, voids in the obtained regenerated target can be further reduced.

The amount of the cushioning material to be disposed can be adjusted by, for example, the number of sheets of the cushioning material to be disposed. In this case, a cushioning material covering the entire raw material powder for a target and a cushioning material covering only part of the raw material powder for a target may be alternately layered, thereby providing stable layers.

The cushioning material is, for example, a blanket made of an inorganic fiber which can resist to temperature and pressure in the sintering step, and the inorganic fiber is at least one kind of fiber selected from, for example, carbon fiber, glass fiber, and alumina fiber.

When a cleaning step of cleaning the erosion part side of the spent target is provided before the powder filling step, the amount of impurities incorporated into the obtained regenerated target can be reduced.

When a cutting step of cutting the spent target so as to decrease a degree of recesses and projections in the erosion part side of the spent target is provided before the powder filling step, voids in the obtained regenerated target can be further reduced.

When the raw material powder for a target has the same composition as the spent target, the composition of the obtained regenerated target is not changed in the thickness direction, thereby allowing the obtained regenerated target to be used to a deeper region.

When the sintering step is carried out in an inert atmosphere, contamination of impurities into the obtained regenerated target can be reduced.

Advantageous Effects of Invention

According to the present invention, the raw material powder for a target made of a metal or made of a metal and a metal compound with covering the erosion part side of the spent target, and the spent target made of a metal sintered body or a composite sintered body of a metal and a metal compound are pressed in the uniaxial direction through the deformable cushioning material made of an inorganic fiber and then the raw material powder for a target is sintered. Therefore, the regenerated target reduced in voids can be produced even by the sintering method with uniaxial pressing.

DESCRIPTION OF EMBODIMENTS

Hereinafter, a method for producing a regenerated target according to the embodiment of the present invention will be described in detail. The embodiment described below covers the hot-pressing sintering method as a sintering method with uniaxial pressing, but the uniaxial pressure sintering method which can be applied to the present invention is not limited to the hot-pressing sintering method. For example, the electric heating sintering method, the spark plasma sintering method, or the like can be applied.

1. Jig for Hot-Pressing

Figure 1:
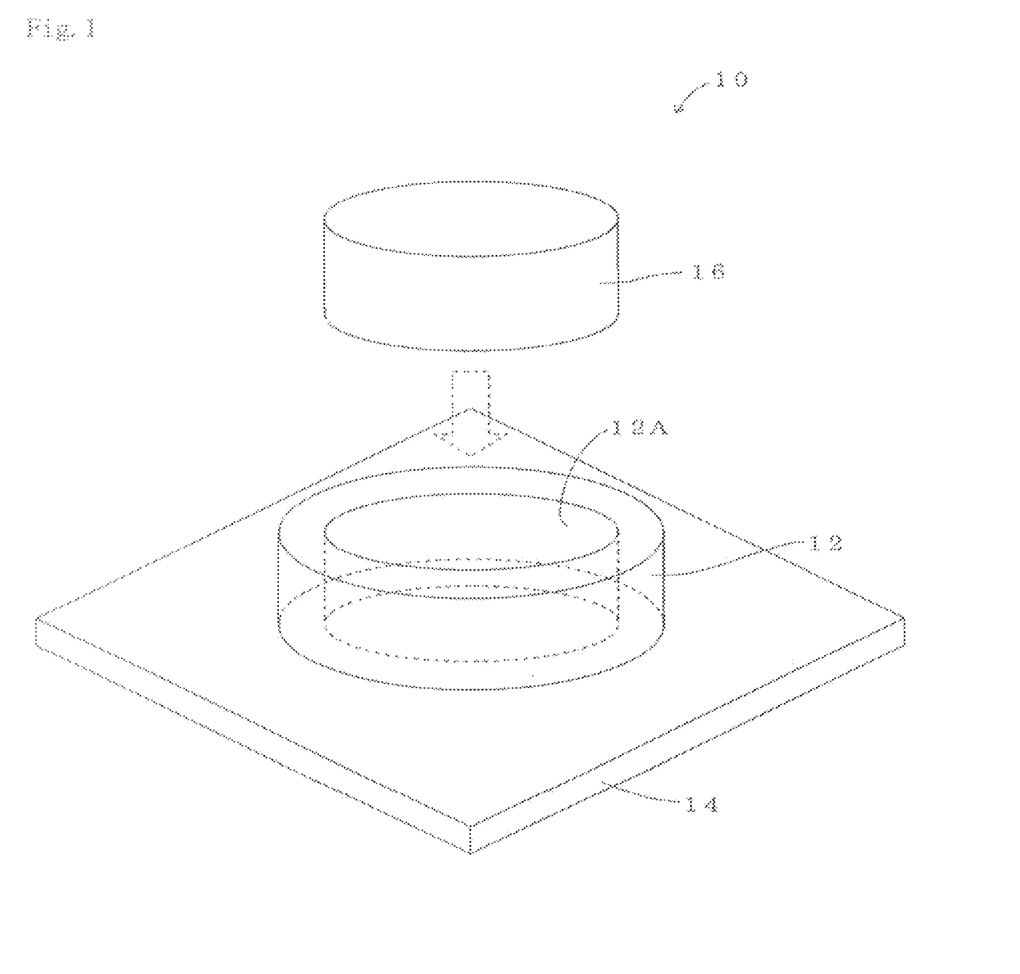
FIG. 1 is a perspective view illustrating a jig 10 for hot-pressing used in the present embodiment.

A jig 10 for hot-pressing used in the present embodiment includes a frame jig 12, a bottom jig 14, and a pushing jig 16 as shown in FIG. 1, and all of them are made of carbon. The shape of the frame jig 12 is a cylindrical form and it has an inner space 12A piercing in a vertical direction (uniaxial direction). In carrying out the present invention, the frame jig 12 is placed on the tabular bottom jig 14, and an object (spent target and raw material powder) to be hot-pressed is disposed in the inner space 12A. The shape of the pushing jig 16 is a cylindrical form to fit to the inner space 12A of the frame jig 12.

The material and the shape of the jig 10 for hot-pressing described herein are an example and are not limited to the material or shape described herein. The material of the jig 10 can be appropriately selected within the range to resist temperature and pressure during hot-pressing. The shape of the jig 10 can be appropriately changed according to the shape of the regenerated target to be produced.

2. Spent Target

Figure 2:
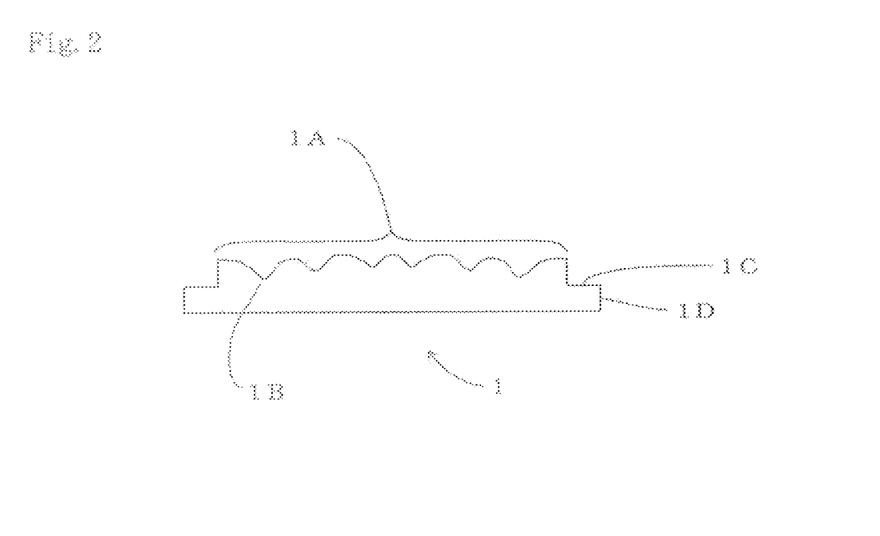
FIG. 2 is a longitudinal cross sectional view schematically illustrating a spent target 1 used in the present embodiment.

As shown in FIG. 2, the spent target 1 used in the present embodiment has been already eroded by sputtering and has an erosion part 1A. The erosion part 1A has an eroded groove 1B which is a deeply recessed portion. Also, a target for sputtering is generally provided with a stepped portion thinner than a body part thereof at a peripheral part thereof to be mounted on a sputtering apparatus, and the spent target 1 used in the present embodiment is also provided with a stepped portion 1C at the peripheral part as shown in FIG. 2.

The material of the spent target 1 used in the present embodiment is not particularly limited, and may be any of a sintered body of a metal (a single component, an alloy), a composite sintered body of a metal and a metal compound (a metal oxide, a metal nitride, for example), or the like, for example.

The shape and size of the spent target 1 used in the present embodiment are also not particularly limited, and one entire sheet of the spent target may be used or a plurality of pieces of the split spent target may be used.

Hereinafter, in the present embodiment, the case in which the regenerated target having the same outer diameter as the spent target is produced using one entire sheet of the spent target will be described.

3. Cleaning Step

To the surface of the spent target 1 are attached not only stain but also a redeposited film deposited during sputtering. Incorporation of these components into the regenerated target causes problems such as generation of particles during sputtering. Therefore, it is preferable that the stain and the redeposited film on the surface of the spent target 1 be removed as many as possible before a powder filling step.

Then, in the present embodiment, a cleaning step is provided before the powder filling step. In the cleaning step, the redeposited film is mechanically scraped off by grinding process, and then subjected to ultrasonic cleaning to remove the stain and the redeposited film attached to the surface of the spent target 1.

4. Powder Filling Step

Figure 3:
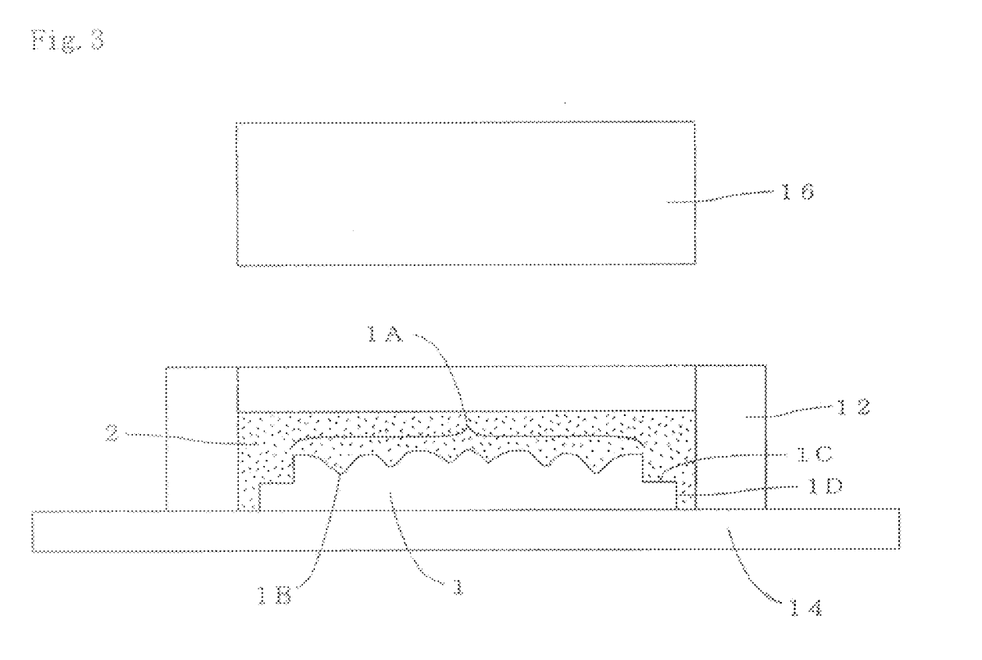
FIG. 3 is a longitudinal cross sectional view schematically illustrating the condition of the main part after completion of the powder filling step in the present embodiment.

FIG. 3 is a longitudinal cross sectional view schematically illustrating the condition of the main part after completion of the powder filling step.

In the powder filling step, the frame jig 12 is first placed on the tabular bottom jig 14 and one sheet of the spent target 1 is placed in the inner space 12A of the frame jig 12.

Then, the inner space 12A of the frame jig 12 is filled with a raw material powder 2 having the same composition as the spent target 1 so that recesses and projections are not generated in the surface of the layer of the raw material powder 2 in filling. The use of the raw material powder 2 having the same composition as the spent target 1 prevents the composition of the obtained regenerated target from changing in the thickness direction, thereby allowing the obtained regenerated target to be used to a deeper region.

When the regenerated target having the same outer diameter as the spent target 1 is produced using one entire sheet of the spent target 1, it is preferable that the inner diameter of the frame jig 12 be slightly (for example, about 4 to 6 mm) larger than the outer diameter of the spent target 1 as shown in FIG. 3. Thus, the interval between a peripheral surface 1D (see FIG. 2) of the spent target 1 and the inner surface of the frame jig 12 is made to be suitable (for example, about 2 to 3 mm). The reason to make the inner diameter of the frame jig 12 slightly larger than the outer diameter of the spent target 1 is that the sintered body obtained by hot-pressing is necessary to be provided with an allowance to be cut in order to be shaped into a target by cutting. Also, the reason to preferably set the interval between the peripheral surface of the spent target 1 and the inner surface of the frame jig 12 to, for example, about 2 to 3 mm is that too small interval between the peripheral surface of the spent target 1 and the inner surface of the frame jig 12 results in that a sufficient pressure is not applied to the raw material powder 2 in the interval during hot-pressing and too large interval results in too large allowance to be cut and becomes uneconomical.

5. Cushioning-Material Disposition Step

Figure 4:
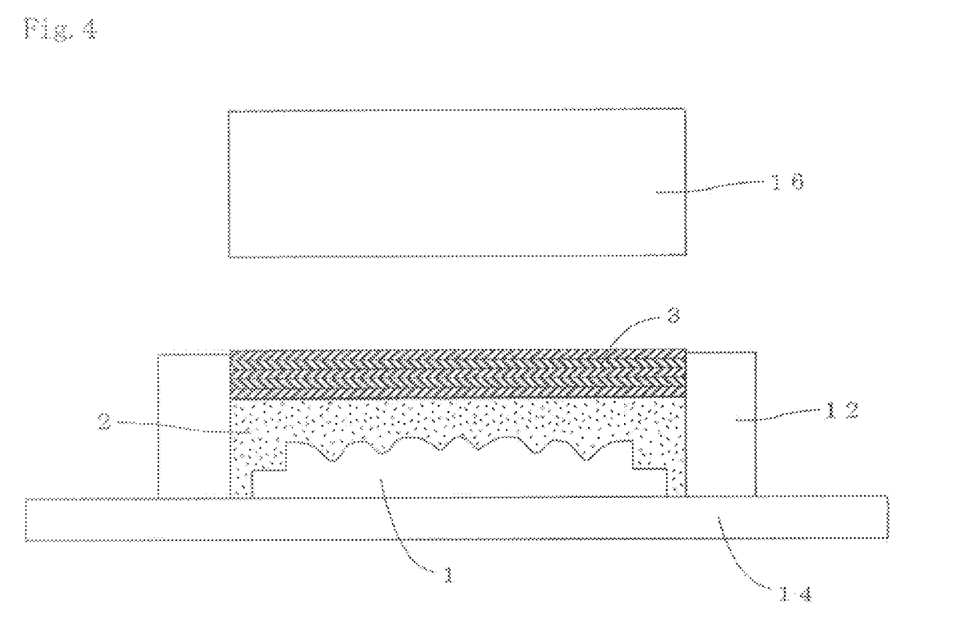
FIG. 4 is a longitudinal cross sectional view schematically illustrating the condition after the cushioning material is disposed in the present embodiment.

In the powder filling step, the spent target 1 is disposed in the inner space 12A of the frame jig 12 and the inner space 12A is filled with the raw material powder 2, and then a cushioning material 3 is disposed to entirely cover the filled raw material powder 2 from the upper side as shown in FIG. 4.

As the cushioning material 3, a material which resists to temperature and pressure during hot-pressing and is deformable under pressure during hot-pressing and has a function to distribute the pressure even if a great pressure is locally applied can be used. Specifically, as the cushioning material 3, a blanket made of a heat-resistant inorganic fiber (for example, carbon fiber, glass fiber, alumina fiber, or the like) such as ceramic fiber, for example, can be used. The blanket is used by cutting it according to the size of the inner space 12A of the frame jig 12.

A plurality sheets of the cushioning material 3 cut according to the size of the inner space 12A are stacked in layers as necessary so that the total thickness of the cushioning material 3 is a necessary and sufficient thickness. When one sheet of the cushioning material 3 provides a necessary and sufficient thickness, a plurality of sheets are not necessary to be layered and one sheet of the cushioning material 3 can be disposed.

Further, the cushioning material 3 is not always necessary to entirely cover the filled raw material powder 2 from the upper side, and may be disposed only on the upper side of the eroded groove 1B, for example. It is noted that, by disposing the cushioning material 3 so as to entirely cover the filled raw material powder 2, an isotropic pressure is more easily applied to the entire raw material powder 2. Therefore, the pressure is also more easily transmitted to the raw material powder 2 with which the eroded groove 1B of the erosion part 1A is filled as well as to the raw material powder 2 with which the stepped portion 1C of the spent target 1 is filled, thereby reducing more voids in the sintered body obtained by hot-pressing. Thus, it is preferable that the cushioning material 3 entirely cover the filled raw material powder 2.

Also, a mold release sheet material (for example, a carbon fiber sheet having a mold release function) may be disposed between the raw material powder 2 with which the inner space 12A of the frame jig 12 is filled and the cushioning material 3. It is to be noted that, the use of the mold release sheet material having high stiffness reduces pressure distribution effect by the cushioning material 3 and therefore an isotropic pressure is difficult to be applied to the entire raw material powder 2.

6. Hot-Pressing Step (Sintering Step)

Hot-pressing is carried out by pressing with the pushing jig 16 from the upper side of the cushioning material 3 disposed in the cushioning-material disposition step. Then, the raw material powder for a target 2 with which the inner space 12A of the frame jig 12 is filled is sintered to integrate the spent target 1 and raw material powder 2.

The temperature, pressure, and time of hot-pressing may be appropriately set according to the composition of the spent target 1 and the raw material powder 2, but basically may be the same as the conditions in producing a new target only with the raw material powder for a target 2.

It is preferable that hot-pressing be carried out in an inert atmosphere in view of reducing contamination of impurities.

The peripheral surface of the obtained sintered body is ground by, for example, about 2 to 3 mm, and the front and rear surfaces are ground by, for example, about 1 mm to provide the regenerated target.

7. Modification 1

Figure 5:
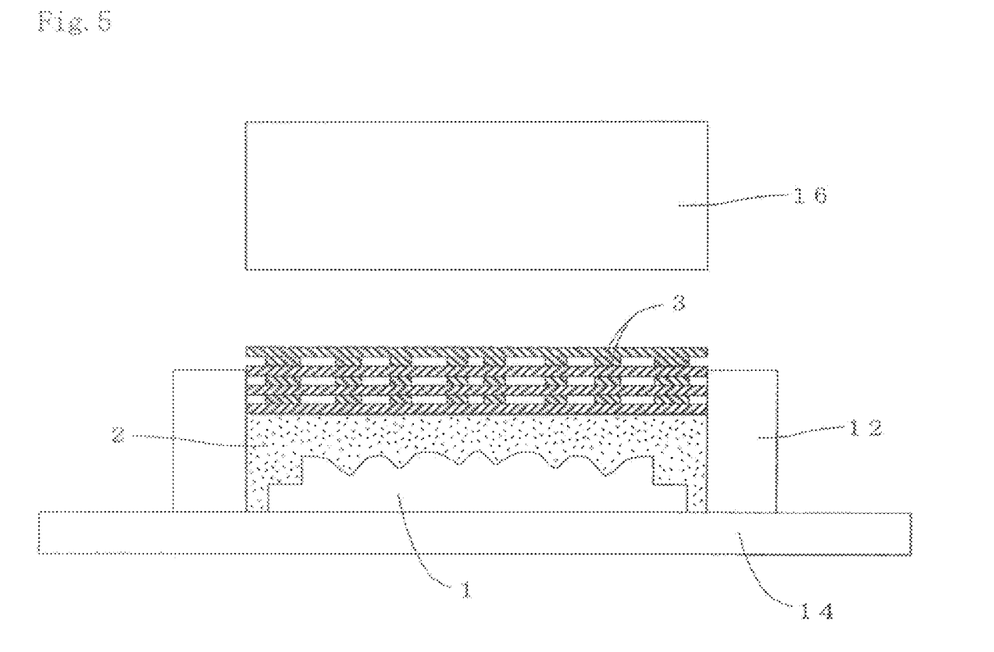
FIG. 5 is a longitudinal cross sectional view schematically illustrating the condition after the cushioning material is disposed in Modification 1 of the present embodiment.

In the embodiment described above, the disposed cushioning material 3 has the uniform thickness throughout the horizontal surface of inner space 12A as shown in FIG. 4. The cushioning material 3, however, may be disposed so that the thicker region of the layer of the raw material powder for a target 2 covering the erosion part 1A side of the spent target 1 results in larger amount of the cushioning material 3 to be disposed on the upper side thereof as shown in FIG. 5. The deposition of the cushioning material 3 in this manner allows an isotropic pressure to be more easily applied to the entire raw material powder 2 and also allows the pressure to be more easily transmitted to the raw material powder 2 with which the eroded groove 1B of the erosion part 1A is filled and the raw material powder 2 with which the stepped portion 1C of the spent target 1 is filled. Accordingly, voids can be further reduced in the sintered body obtained by hot-pressing.

8. Modification 2

Before the powder filling step may be provided a cutting step of cutting so as to decrease the degree of recesses and projections in the erosion part 1A side of the spent target 1. Through this step, the degree of recesses and projections is decreased in the erosion part 1A side of the spent target 1 and an isotropic pressure is more easily applied to the entire raw material powder 2 during hot-pressing. Accordingly, voids can be further reduced in the sintered body obtained by hot-pressing.

EXAMPLES (Example 1)

An 88(Co-20Cr)-12TiO$_2$ target was used as the spent target, and the regenerated target was produced by the hot-pressing method.

First, the spent target to be used was subjected to the grinding process to mechanically scrape off the redeposited film and was subsequently subjected to the cleaning process with ultrasonic cleaning.

Next, the frame jig 12 was placed on the tabular bottom jig 14, and one sheet of the spent target after the cleaning process was placed in the inner space 12A of the frame jig 12 with the erosion part side facing upward.

Then, the inner space 12A of the frame jig 12 was filled with a raw material powder for an 88(Co-20Cr)-12TiO$_2$ target having the same composition as the spent target so that recesses and projections were not generated in the surface of the layer of the raw material powder in filling.

The frame jig 12 having an inner diameter of 184 mm was used. Since the outer diameter of the spent target was 180 mm, the interval between the peripheral surface of the spent target and the inner surface of the frame jig 12 was about 2 mm.

Two layered carbon fiber sheets (a sheet of 0.2 mm thickness) having a mold release function were disposed on the raw material powder with which the inner space 12A of the frame jig 12 was filled and moreover five layered blankets (a blanket of 12.5 mm thickness) made of glass fiber were disposed on the carbon fiber sheets as the cushioning material.

Then, hot-pressing was carried out by pressing with the pushing jig 16, and the raw material powder for a target with which the inner space 12A of the frame jig 12 was filled was sintered to integrate the spent target and the raw material powder. An electric heater was used for heating and the conditions of hot-pressing are a temperature of 1100° C., pressure of 20.0 MPa, and time of 360 min.

The mass of the spent target used was 1037.31 g, the mass of the raw material powder for a target was 442.69 g, and the mass of the sintered body after hot-pressing was 1477.43 g.

Figure 6A:
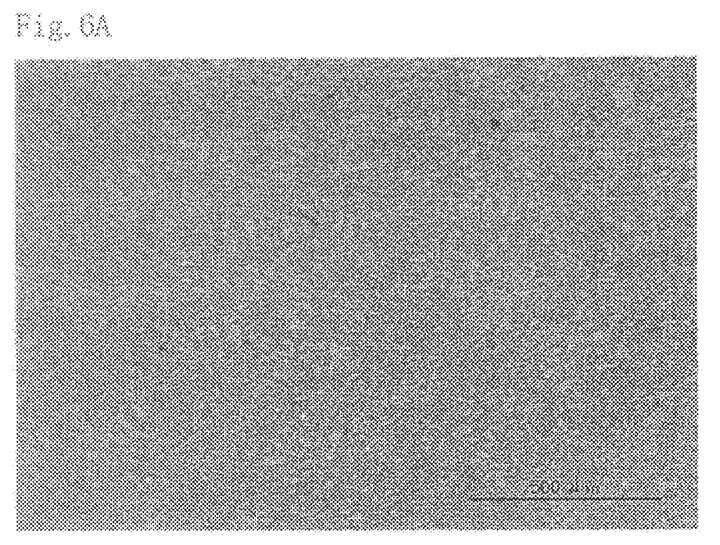
FIG. 6A is a metallographic micrograph of the sintered body of the raw material powder with which the eroded groove of the erosion part has been filled in Example 1 (low magnification micrograph)
Figure 6B:
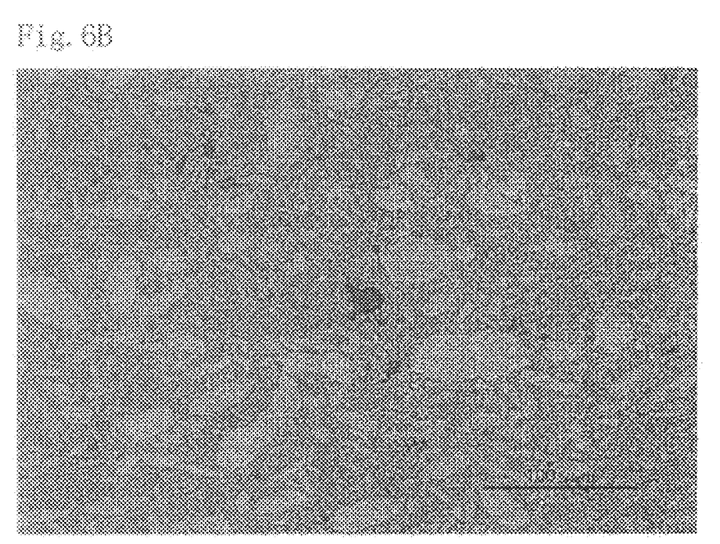
FIG. 6B is a metallographic micrograph of the sintered body of the raw material powder with which the eroded groove of the erosion part has been filled in Example 1 (high magnification micrograph enlarged in the vicinity of a void portion)

FIGS. 6A and 6B show a metallographic micrograph of the sintered body of the raw material powder with which the eroded groove of the erosion part of the spent target was filled among the regions of the sintered body after hot-pressing. FIG. 6A is a low magnification micrograph and FIG. 6B is a high magnification micrograph enlarged in the vicinity of a void portion. Voids were extremely little and were hardly observed as shown in FIGS. 6A and 6B (compared to the metallographic micrographs (FIGS. 10A and 10B) of Comparative Example described below).

(Example 2)

As shown in FIG. 5, seven sheets of the cushioning material were disposed on the upper side of the thick region of the layer of the raw material powder for a target covering the erosion part side of the spent target (the eroded groove of the erosion part, and the stepped portion), and four sheets of the cushioning material were disposed on the other regions. The mass of the spent target used was 1030.85 g and the mass of the raw material powder for a target was 449.15 g. Except these, hot-pressing was carried out in the same manner as in Example 1.

The mass of the sintered body after hot-pressing was 1476.91 g.

Figure 7:
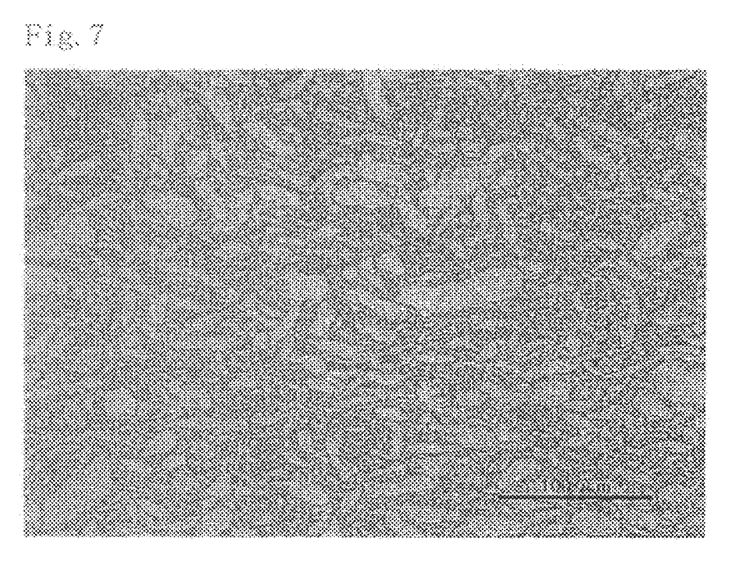
FIG. 7 is a metallographic micrograph of the sintered body of the raw material powder with which the eroded groove of the erosion part has been filled in Example 2.

FIG. 7 shows a metallographic micrograph of the sintered body of the raw material powder with which the eroded groove of the erosion part of the spent target was filled among the regions of the sintered body after hot-pressing. Voids were not observed at all as shown in FIG. 7.

(Example 3)

Figure 8A:
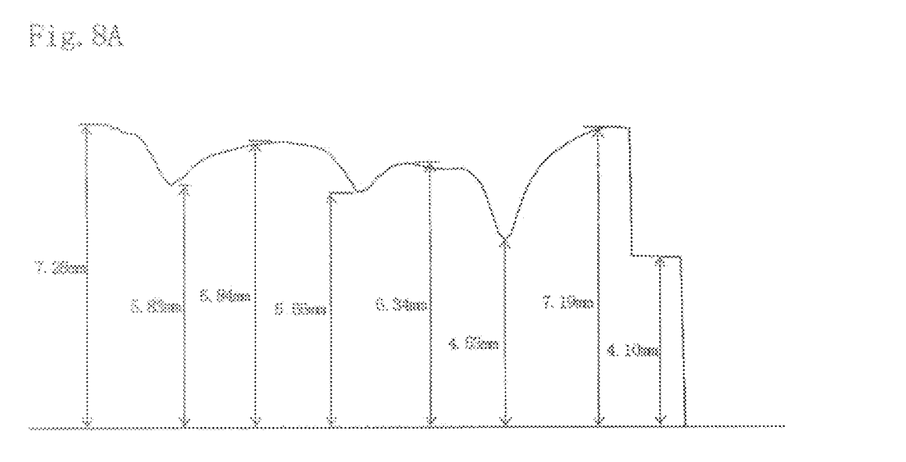
FIG. 8A is a cross sectional view of the spent target in the thickness direction before cutting.
Figure 8B:
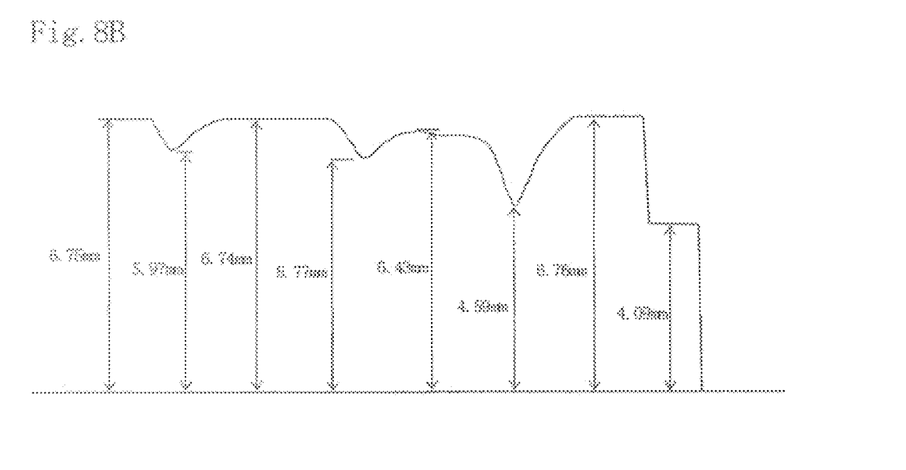
FIG. 8B is a cross sectional view of the spent target in the thickness direction after cutting.

The erosion part of the spent target was cut before filling it with the raw material powder for a target to decrease the degree of recesses and projections of the erosion part. FIG. 8A is a cross sectional view of the spent target in the thickness direction before cutting, and FIG. 8B is a cross sectional view of the spent target in the thickness direction after cutting. The mass of the spent target used was 1098.72 g before cutting and 1081.52 g after cutting, and the mass of the raw material powder for a target was 501.28 g. Except these, hot-pressing was carried out in the same manner as in Example 1.

The mass of the sintered body after hot-pressing was 1578.27 g.

Figure 9:
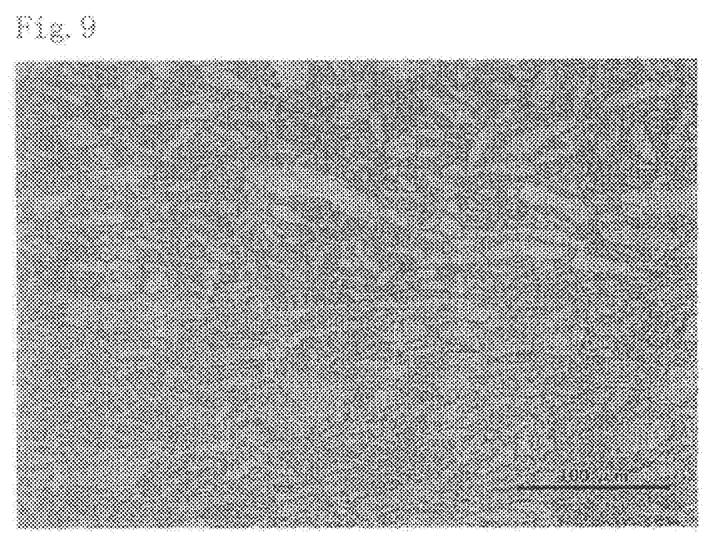
FIG. 9 is a metallographic micrograph of the sintered body of the raw material powder with which the eroded groove of the erosion part has been filled in Example 3.

FIG. 9 shows a metallographic micrograph of the sintered body of the raw material powder with which the eroded groove of the erosion part of the spent target was filled among the regions of the sintered body after hot-pressing. Voids were not observed at all as shown in FIG. 9.

(Comparative Example 1)

In the same manner as general hot-pressing, hot-pressing was carried out without a cushioning material. The mass of the spent target used was 1100.24 g, and the mass of the raw material powder for a target was 349.76 g. Except these, hot-pressing was carried out in the same manner as in Example 1.

The mass of the sintered body after hot-pressing was 1446.85 g.

Figure 10A:
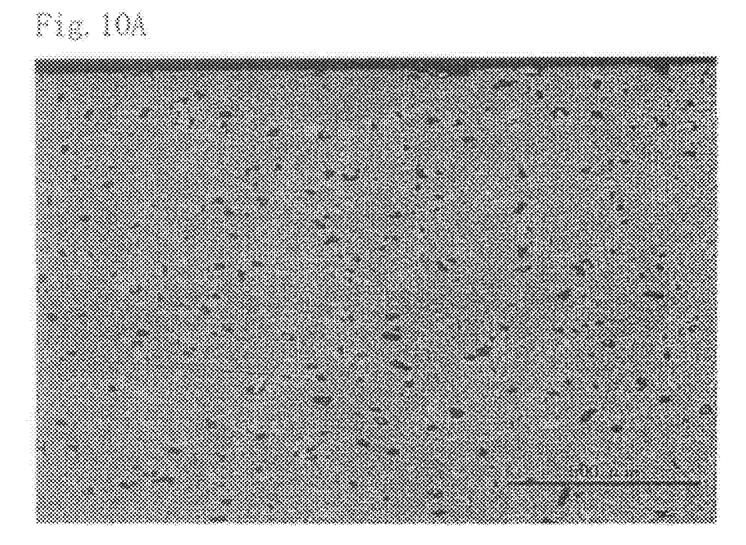
FIG. 10A is a metallographic micrograph of the sintered body of the raw material powder with which the eroded groove of the erosion part has been filled in Comparative Example 1 (low magnification micrograph)
Figure 10B:
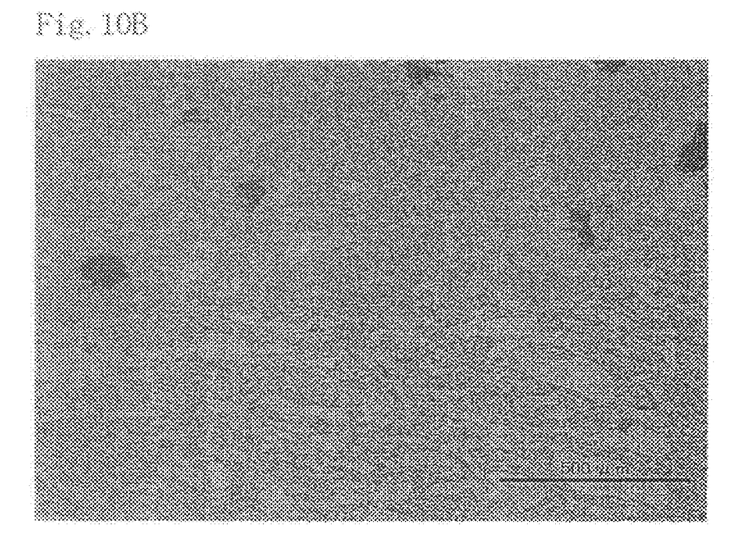
FIG. 10B is a metallographic micrograph of the sintered body of the raw material powder with which the eroded groove of the erosion part has been filled in Comparative Example 1 (high magnification micrograph enlarged in the vicinity of a void portion)

FIGS. 10A and 10B each show a metallographic micrograph of the sintered body of the raw material powder with which the eroded groove of the erosion part of the spent target was filled among the regions of the sintered body after hot-pressing. FIG. 10A is a low magnification micrograph and FIG. 10B is a high magnification micrograph enlarged in the vicinity of the void portion. A lot of voids were observed as shown in FIGS. 10A and 10B.

(Consideration)

Compared to Comparative Example 1 in which hot-pressing was carried out without a cushioning material in the same manner as general hot-pressing, in Example 1 in which hot-pressing was carried out with the cushioning material disposed, the sintered body of the raw material powder with which the eroded groove of the erosion part of the spent target was filled had extremely reduced voids.

In Example 2, the number of sheets of the cushioning material disposed on the upper side of the thick region of the layer of the raw material powder for a target covering the erosion part side of the spent target (the eroded groove of the erosion part, and the stepped portion) was increased. In this example 2, voids were not observed at all in the sintered body of the raw material powder with which the eroded groove of the erosion part of the spent target was filled.

In addition, in Example 3 the erosion part of the spent target was cut before filling it with the raw material powder for a target to decrease the degree of recesses and projections of the erosion part and the cushioning material was disposed in the same manner as in Example 1. In this Example 3, voids were not observed at all in the sintered body of the raw material powder with which the eroded groove of the erosion part of the spent target was filled.

Therefore, it is highly effective to carry out hot-pressing with the cushioning material disposed in order to reduce voids in the regenerated target.

Moreover, it is effective to increase the amount of the cushioning material disposed on the upper side of the thick region of the layer of the raw material powder for a target (the eroded groove of the erosion part, and the stepped portion) in order to reduce further voids in the regenerated target.

Also, it is effective to decrease the degree of recesses and projections of the erosion part by cutting the erosion part of the spent target before filling the raw material powder for a target in order to reduce further voids in the regenerated target.

INDUSTRIAL APPLICABILITY

According to the present invention, the regenerated target reduced in voids can be produced even by the sintering method with uniaxial pressing.

REFERENCE SIGNS LIST

1 . . . spent target
1A . . . erosion part
1B . . . eroded groove
1C . . . stepped portion
1D . . . peripheral surface
2 . . . raw material powder for a target
3 . . . cushioning material
10 . . . jig
12 . . . frame jig
12A . . . inner space
14 . . . tabular bottom jig
16 . . . pushing jig

The invention claimed is:

1. A method for producing a regenerated target, comprising:
   a powder filling step of disposing a spent target made of a metal sintered body or a composite sintered body of a metal and a metal compound in an inner space of a frame jig having the inner space piercing in a uniaxial direction, and filling the inner space with a raw material powder for a target made of a metal or made of a metal and a metal compound to cover an erosion part side of the spent target with the raw material powder for a target;
   a cushioning-material disposition step of disposing a deformable cushioning material made of an inorganic fiber so that the raw material powder for a target with which the inner space has been filled in the powder filling step is sandwiched between the spent target and the cushioning material; and
   a sintering step of pressing the raw material powder for a target with which the inner space has been filled and the spent target in the uniaxial direction through the cushioning material disposed in the cushioning-material disposition step and sintering them,
   wherein an inner diameter of the frame jig is 4 mm to 6 mm larger than an outer diameter of the spent target so that there is a spacing between a peripheral edge surface of the spent target and an inner surface of the frame jig, and
   wherein the filling of the inner space with a raw material powder further disposes the raw material powder within the spacing between the peripheral edge surface of the spent target and the inner surface of the frame jig.

2. The method for producing a regenerated target according to claim 1, wherein in the cushioning-material disposition step the cushioning material is disposed so as to cover the entire raw material powder for a target.

3. The method for producing a regenerated target according to claim 1, wherein in the cushioning-material disposition step a plurality of layered sheets of the cushioning material are disposed.

4. The method for producing a regenerated target according to claim 1, wherein the cushioning material is a blanket made of an inorganic fiber that can resist temperature and pressure in the sintering step.

5. The method for producing a regenerated target according to claim 4, wherein the inorganic fiber is at least one kind of fiber selected from carbon fiber, glass fiber, and alumina fiber.

6. The method for producing a regenerated target according to claim 1, further comprising, before the powder filling step, a cleaning step of cleaning the erosion part side of the spent target.

7. The method for producing a regenerated target according to claim 1, further comprising, before the powder filling step, a cutting step of cutting the spent target so as to decrease a degree of recesses and projections in the erosion part side of the spent target.

8. The method for producing a regenerated target according to claim 1, wherein the raw material powder for a target has the same composition as the spent target.

9. The method for producing a regenerated target according to claim 1, wherein the sintering step is carried out in an inert atmosphere.

10. A method for producing a regenerated target, comprising:
a powder filling step of disposing a spent target made of a metal sintered body or a composite sintered body of a metal and a metal compound in an inner space of a frame jig having the inner space piercing in a vertical direction with an erosion part side facing upward, and filling the inner space with a raw material powder for a target made of a metal or made of a metal and a metal compound to cover the erosion part side of the spent target with the raw material powder for a target;
a cushioning-material disposition step of disposing a deformable cushioning material made of an inorganic fiber on an upper side of the raw material powder for a target with which the inner space has been filled in the powder filling step; and
a sintering step of pressing the raw material powder for a target with which the inner space has been filled and the spent target from the upper side in a uniaxial direction through the cushioning material disposed in the cushioning-material disposition step and sintering them,
wherein an inner diameter of the frame jig is 4 mm to 6 mm larger than an outer diameter of the spent target so that there is a spacing between a peripheral edge surface of the spent target and an inner surface of the frame jig, and wherein the filling of the inner space with a raw material powder further disposes the raw material powder within the spacing between the peripheral edge surface of the spent target and the inner surface of the frame jig.

11. The method for producing a regenerated target according to claim 10, wherein in the cushioning-material disposition step the cushioning material is disposed so as to cover the entire raw material powder for a target.

12. The method for producing a regenerated target according to claim 10, wherein in the cushioning-material disposition step a plurality of layered sheets of the cushioning material are disposed.

13. The method for producing a regenerated target according to claim 10, wherein the cushioning material is a blanket made of an inorganic fiber that can resist temperature and pressure in the sintering step.

14. The method for producing a regenerated target according to claim 13, wherein the inorganic fiber is at least one kind of fiber selected from carbon fiber, glass fiber, and alumina fiber.

15. The method for producing a regenerated target according to claim 10, further comprising, before the powder filling step, a cleaning step of cleaning the erosion part side of the spent target.

16. The method for producing a regenerated target according to claim 10, further comprising, before the powder filling step, a cutting step of cutting the spent target so as to decrease a degree of recesses and projections in the erosion part side of the spent target.

17. The method for producing a regenerated target according to claim 10, wherein the raw material powder for a target has the same composition as the spent target.

18. The method for producing a regenerated target according to claim 10, wherein the sintering step is carried out in an inert atmosphere.

* * * * *